US010015904B2

(12) United States Patent
Kull et al.

(10) Patent No.: US 10,015,904 B2
(45) Date of Patent: Jul. 3, 2018

(54) REMOVABLE FAN TRAY

(71) Applicant: Juniper Networks, Inc., Sunnyvale, CA (US)

(72) Inventors: John Kull, Redwood City, CA (US); David J. Lima, Gilroy, CA (US); Gilbert Vanhoy, San Jose, CA (US)

(73) Assignee: Juniper Networks, Inc., Sunnyvale, CA (US)

(*) Notice: Subject to any disclaimer, the term of this patent is extended or adjusted under 35 U.S.C. 154(b) by 137 days.

(21) Appl. No.: 15/010,997

(22) Filed: Jan. 29, 2016

(65) Prior Publication Data

US 2016/0157380 A1 Jun. 2, 2016

Related U.S. Application Data

(63) Continuation of application No. 13/630,417, filed on Sep. 28, 2012, now Pat. No. 9,253,927.

(51) Int. Cl.
*H05K 7/20* (2006.01)
*H02G 3/38* (2006.01)
*H05K 7/14* (2006.01)
*F28D 1/053* (2006.01)

(52) U.S. Cl.
CPC .............. *H05K 7/20* (2013.01); *H02G 3/38* (2013.01); *H05K 7/14* (2013.01); *H05K 7/20581* (2013.01); *F28D 1/05383* (2013.01)

(58) Field of Classification Search
CPC ........ H05K 7/20; H05K 7/14; H05K 7/20581; H05K 7/1427; G06F 1/183; G06F 1/187; H02G 3/38; F28D 3/00–3/04; F28D 1/05383; F28D 1/05391; F28D 1/05325

USPC .......................................................... 211/26
See application file for complete search history.

(56) References Cited

U.S. PATENT DOCUMENTS

| | | |
|---|---|---|
| 2,843,806 A | 7/1958 | O'Neill |
| 3,836,944 A | 9/1974 | Lawson |
| 3,895,215 A | 7/1975 | Gordon |
| 5,079,438 A | 1/1992 | Heung |
| 5,477,416 A | 12/1995 | Schkrohowsky et al. |
| 5,654,873 A | 8/1997 | Smithson et al. |
| 5,663,868 A | 9/1997 | Stalley |
| 5,751,549 A | 5/1998 | Eberhardt et al. |
| 5,912,801 A | 6/1999 | Roy et al. |
| 6,163,454 A | 12/2000 | Strickler |

(Continued)

OTHER PUBLICATIONS

Electronic design, "Optimized Interconnect Eliminates Limits in Orthogonal Architectures" [online] Retrieved from the Internet: <URL: http://electronicdesign.com/Articles/Print.cfm?AD=1&ArticleID=13277>, Sep. 1, 2006.

*Primary Examiner* — Ko H Chan
(74) *Attorney, Agent, or Firm* — Cooley LLP (57) ABSTRACT

Fan trays and components thereof are described herein. In some embodiments, a removable, compact fan tray is configured to be disposed within a slot of a chassis. The fan tray can be latchably coupled to the chassis, and/or can include a light source, such as an LED operable to depict the status of the fan tray. Leads of the light source can be disposed within an sleeve operable to contain and/or insulate the leads. The fan tray can, in some embodiments, be configured to be keyed to a particular type of chassis slot, for example, a slot associated with an air flow direction.

20 Claims, 9 Drawing Sheets

(56) References Cited

U.S. PATENT DOCUMENTS

| | | |
|---|---|---|
| 6,280,318 B1 | 8/2001 | Criss-Puszkiewicz et al. |
| 6,449,150 B1 | 9/2002 | Boone |
| 6,452,797 B1 | 9/2002 | Konstad |
| 6,462,948 B1 | 10/2002 | Leija et al. |
| 6,564,858 B1 | 5/2003 | Stahl et al. |
| 6,602,090 B2 | 8/2003 | Kato |
| 6,603,662 B1 | 8/2003 | Ganrot |
| 6,628,520 B2 | 9/2003 | Patel et al. |
| 6,721,180 B2 | 4/2004 | Le et al. |
| 6,755,242 B2 | 6/2004 | White |
| 6,768,640 B2 | 7/2004 | Doblar et al. |
| 6,778,386 B2 | 8/2004 | Garnett et al. |
| 6,876,549 B2 | 4/2005 | Beitelmal et al. |
| 6,879,486 B1 | 4/2005 | Banton et al. |
| 6,900,387 B2 | 5/2005 | Gravell et al. |
| 6,904,968 B2 | 6/2005 | Beitelmal et al. |
| 6,912,131 B2 | 6/2005 | Kabat |
| 7,074,123 B2 | 7/2006 | Bettridge |
| 7,079,387 B2 | 7/2006 | Brooks et al. |
| 7,083,659 B1 | 8/2006 | Joyce et al. |
| 7,088,583 B2 | 8/2006 | Brandon et al. |
| 7,112,131 B2 | 9/2006 | Rasmussen et al. |
| 7,151,229 B2 | 12/2006 | Mueller |
| 7,154,748 B2 | 12/2006 | Yamada |
| 7,158,379 B2 | 1/2007 | Sanders et al. |
| 7,164,581 B2 | 1/2007 | Carullo et al. |
| 7,209,351 B2 | 4/2007 | Wei |
| 7,215,552 B2 | 5/2007 | Shipley et al. |
| 7,245,632 B2 | 7/2007 | Heffernan et al. |
| 7,256,992 B1 | 8/2007 | Stewart et al. |
| 7,256,995 B2 | 8/2007 | Wrycraft et al. |
| 7,280,356 B2 | 10/2007 | Pfahnl et al. |
| 7,434,412 B1 | 10/2008 | Miyahira |
| 7,548,421 B2 | 6/2009 | Malone et al. |
| 7,722,359 B1 | 5/2010 | Frangioso et al. |
| 7,813,120 B2 | 10/2010 | Vinson et al. |
| 7,885,066 B2 | 2/2011 | Boyden et al. |
| 8,081,459 B2 | 12/2011 | Doll et al. |
| 9,253,927 B1 | 2/2016 | Kull et al. |
| 2002/0018339 A1 | 2/2002 | Uzuka et al. |
| 2002/0126449 A1 | 9/2002 | Casebolt |
| 2004/0001311 A1 | 1/2004 | Doblar et al. |
| 2004/0130868 A1 | 7/2004 | Schwartz et al. |
| 2004/0264145 A1 | 12/2004 | Miller et al. |
| 2005/0180103 A1 | 8/2005 | Ku |
| 2005/0207134 A1 | 9/2005 | Belady et al. |
| 2005/0281005 A1 | 12/2005 | Carullo et al. |
| 2006/0002084 A1 | 1/2006 | Wei |
| 2006/0126292 A1 | 6/2006 | Pfahnl et al. |
| 2007/0153462 A1 | 7/2007 | Crippen et al. |
| 2007/0223199 A1 | 9/2007 | Fujiya et al. |
| 2008/0158814 A1 | 7/2008 | Hattori |
| 2008/0225479 A1 | 9/2008 | Zieman et al. |
| 2009/0059520 A1 | 3/2009 | Tanaka et al. |
| 2009/0109612 A1 | 4/2009 | Moss et al. |
| 2009/0122484 A1 | 5/2009 | Caveney |
| 2009/0296352 A1 | 12/2009 | Lima |
| 2010/0014248 A1 | 1/2010 | Boyden et al. |
| 2012/0069514 A1* | 3/2012 | Ross .................. H05K 7/20727 361/679.33 |

* cited by examiner

REMOVABLE FAN TRAY

CROSS-REFERENCE TO RELATED APPLICATIONS

This application is a continuation of U.S. patent application Ser. No. 13/630,417, filed Sep. 28, 2012, now U.S. Pat. No. 9,253,927, entitled "Removable Fan Tray," the entirety of which is incorporated herein by reference.

BACKGROUND

Some embodiments described herein relate to fan trays configured to be disposed within a chassis, such as a server rack and/or a computer case.

The size of known fan trays can limit the space available for cooling components, house an insufficient number of fans, not latch, have an inconvenient latching mechanism, and/or can extend outside the front panel of the chassis. In some applications, such as when a server rack contains a 1U top-of-rack switch, removable and/or compact fan trays are desired, because, as the size of the fan tray decreases, more space within the rack can be made available for computing components. A need, therefore, exists for a removable and compact fan tray.

SUMMARY

Fan trays and components thereof are described herein. In some embodiments, a removable, compact fan tray is configured to be disposed within a slot of a chassis. The fan tray can be latchably coupled to the chassis, and/or can include a light source, such as a light emitting diode (LED) operable to depict the status of the fan tray. Leads of the light source can be disposed within an sleeve operable to contain and/or insulate the leads. The fan tray can, in some embodiments, be configured to be keyed to a particular type of chassis slot, for example, a slot associated with an air flow direction.

DETAILED DESCRIPTION

Fan trays and components thereof are described herein. A fan tray can be operable to be slideably disposed within a chassis of, for example, a server rack and/or a rack mounted unit. The fan tray can provide cooling airflow to heat sources housed within the chassis, for example, computing components, such as a top-of-rack switch. Some embodiments described herein relate to compact fan trays operable to cool 1U form factor components.

In some embodiments, the fan tray can have a body, a handle, and a latch. An end portion of the handle can be rotateably coupled to the body. A first portion of the latch can be coupled to the handle. The body can define at least a portion of a recess configured to selectively contain a portion of the latch. When the handle is in a first position, for example, disposed against a face of the body, the second portion of the latch can be disposed out of the recess. In some embodiments, when the second portion of the latch is disposed out of the recess, the second portion of the latch can project from the body of the fan tray and be operable to latch to an associated structure, for example, of a chassis. When the handle is in a second position, for example, extending out from the face of the body, the latch can be disposed within the recess. In some embodiments, when the latch is disposed within the recess, the fan tray can be slideable within the chassis, for example, by pulling the handle and/or pushing the fan tray.

In some embodiments, a sleeve including channels can be configured to be disposed within a fan tray. The channels of the sleeve can be configured to receive wires and/or insulate the wires of a light source, for example a positive and a negative lead of the light source. The channels can electrically insulate the wires from each other and/or from contact with other wires or structures that can be disposed within and/or part of the fan tray.

In some embodiments, a fan tray shoe configured to be removeably coupled to a fan tray can have a key, such as a slot, groove, projection, and/or hole. The key can be in a first position or a second position. The first position can be associated with a first airflow direction, and the second position can be associated with a second airflow direction. In other embodiments, the key positions can indicate other information such as a fan having one rotor or two rotors, a fan having one fan speed or a different fan speed, a fan having one drive voltage or a different drive voltage. In some embodiments, the key can be configured to be accepted by or excluded from an associated structure of a chassis, such that the fan tray can only be disposed and/or is only operable within a slot of the chassis associated with the appropriate airflow direction.

As used in this specification, the singular forms "a," "an" and "the" include plural referents unless the context clearly dictates otherwise. Thus, for example, the term "an opening" is intended to mean a single opening or a combination of openings.

Figure 1:
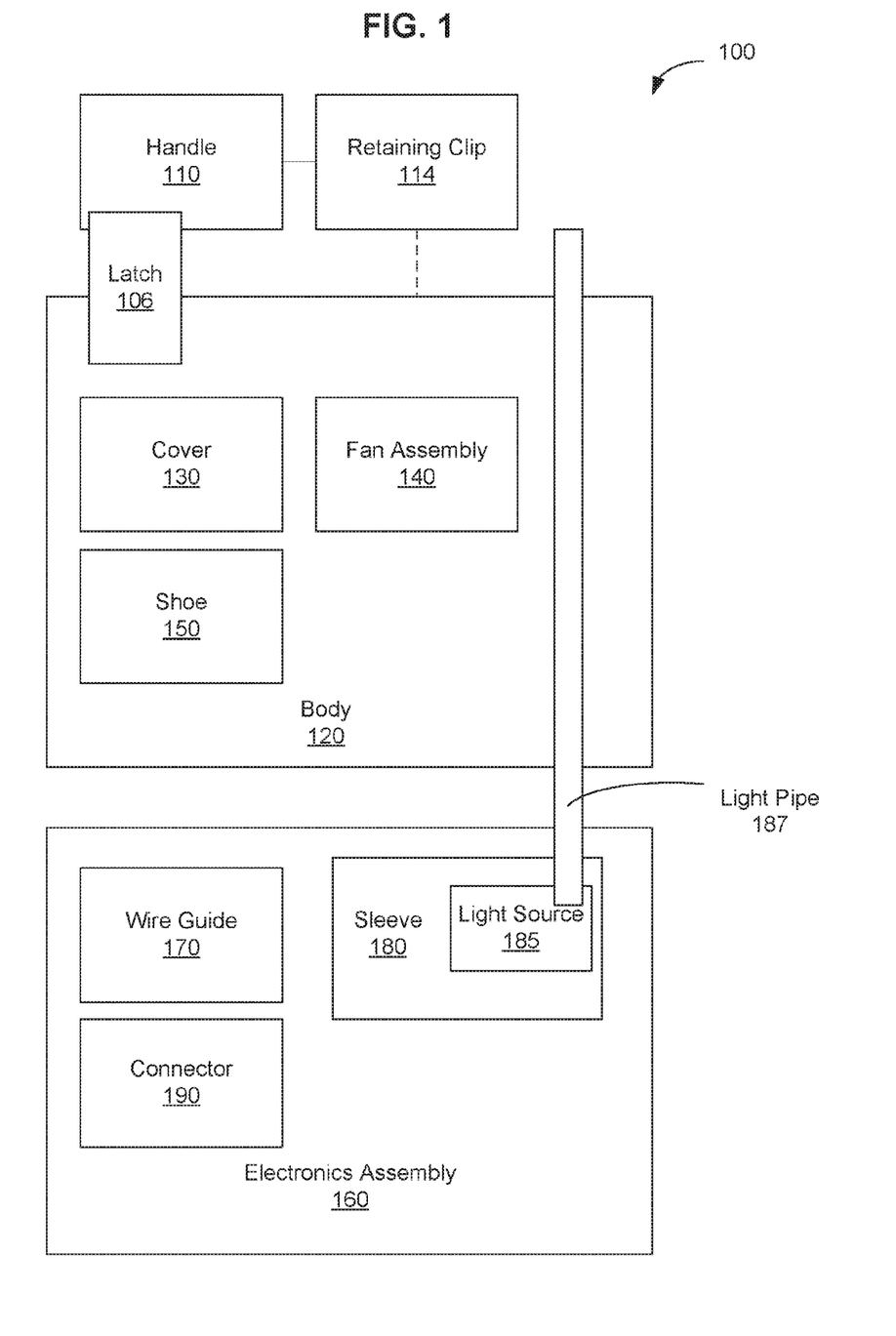
FIG. 1 is a schematic diagram of a fan tray, according to an embodiment.

FIG. 1 is a schematic diagram of a fan tray 100, according to an embodiment. The fan tray 100 includes a handle 110, a body 120, and an electronics assembly 160. The fan tray 100 can be operable to be slideably disposed within a chassis (not shown), for example, a server rack unit and/or a server rack. The handle 110 can be coupled to the body 120 and can be used to install and/or remove the fan tray 100 from the chassis, as well as to provide a convenient structure for carrying the fan tray 100. The body 120 of the fan tray 100 can include structural and/or cooling elements of the fan tray 120. The electronics assembly 160 can include wiring and/or other electronic components to power and/or manage the cooling functions of the fan tray 100.

The handle 110 can be rotatably coupled to the body 120. For example, in some embodiments, the handle 110 can have two pins operable to mate with associated holes of the body 120, such that the handle 110 and the body 120 collectively define a hinge. The handle 110 can thus rotate from a position in which the handle 110 is disposed against a surface of the body 120 to a position in which the handle 110 extends from the body 120. When the handle 120 extends from the body 110, the handle 120 can provide a convenient structure for grasping the fan tray 100, for example, while sliding the fan tray 100 out of the chassis, and/or carrying the fan tray 100.

A latch 106 can be operable to secure the handle 110 to the body 120, for example, when the handle 110 is disposed against the surface of the body 120. The body 120 and the handle 110 can have associated components, such as a hook-and-loop fastener, a snap-fit coupling, and/or any other suitable coupling operable to latch the handle 110 to the body 120.

A retaining clip 114 can be operable to selectively couple and decouple the fan tray 100 to the chassis. In some embodiments, the retaining clip 114 can temporarily couple or retain the fan tray 100 to the chassis when the handle 110 is disposed against the surface of the body 120. Conversely, when the handle 110 extends from the body 120, the fan tray 100 can be slideably disposed within the chassis. For example, the retaining clip 114 can be coupled to the handle 110, such that a surface of the retaining clip 114 mateingly couples to a portion of the chassis when the handle is disposed against a surface of the body 120. When the handle 110 is positioned such that it extends from the body 120, the retaining clip 114 can rotate with the handle 110 such that it is disposed in a recess defined, at least in part, by the body 120 and such that the retaining clip 114 is not coupled to the chassis.

The body 120 can include a cover 130, a fan assembly 140, and a fan tray shoe 150. In some embodiments, the cover 130 can define the front of the fan tray 100 and the fan tray shoe 150 can define the rear of the fan tray 100. The fan assembly 140 can be disposed between and/or supported at opposite ends by the cover 130 and/or the fan tray shoe 150. The fan assembly 140 can be operable to generate an airflow. One or more screws, bolts, clips, and/or other suitable fastening means can couple the cover 130, the fan assembly 140, and/or the fan tray shoe 150. For example, one or more of the cover 130, the fan assembly 140, and the fan tray shoe 150 can have a corresponding threaded hole or holes, such that a threaded fastener or fasteners can be used to couple the cover 130, fan assembly 140, and the fan tray shoe 150 together to collectively form the body 120.

In some embodiments, the cover 130 can define an inlet of a flow path and the fan tray shoe 150 can define an outlet of that flow path. In other embodiments, the fan tray shoe 150 can define the inlet of a flow path, and the cover 130 can define the outlet of that flow path.

The cover 130 can be operable to reduce noise and/or distribute air passing therethrough. For example, the opening defined by the cover 130 can include a screen, a plurality of openings, and/or a flow-straightening element. The cover 130 can provide a finger-guard to prevent a user from contacting the fan assembly 140 when the fan tray 100 is in operation. The cover 130 can also be operable to reduce or screen electromagnetic interference. For example, the cover 130 can reduce or screen against from electromagnetic radiation from electronics within the fan tray 100 from affecting electronics outside the fan tray 100. Similarly, the cover 130 can reduce or screen against electromagnetic radiation from electronics outside the fan tray 100 that might otherwise affect electronics within of the fan tray 100 or the chassis in which it resides.

The fan assembly 140 can include one or more rotors and/or stators mounted in series and/or parallel and operable to generate the air-flow. For example, the fan assembly 140 can include two 40×40×56 mm dual-rotor fans mounted in parallel. In such an embodiment, the overall dimensions of the fan tray 100 can be approximately 40.5×81×98 mm. The fan assembly 140 can be operable to move air either into or out of the chassis.

The fan tray shoe 150 can be keyed to the chassis. Similarly stated, the fan tray shoe 150 can be operable to be physically coupled to and/or engage one or more structures disposed within the chassis based on the structure of the fan tray shoe 150 and the structure of the chassis. The fan tray shoe 150 can be operable to prevent the fan tray 100 from being improperly disposed within the chassis. For example, the fan tray shoe and the chassis can be collectively configured such that the fan tray 100 cannot be disposed upside down. In some embodiments, the fan tray shoe 150 can have one or more projections, recesses, and/or grooves; the chassis can have associated structures such that an improperly oriented fan tray 100 can be excluded. In some such embodiments, the fan tray 100 can be configured to provide airflow in one predetermined direction, e.g., into the chassis, and the fan tray shoe 150 and the chassis can be collectively configured such that only fan trays 100 providing flow in that one predetermined direction can be disposed therein.

In some embodiments, the fan tray shoe 150 can be coupled to the body in more than one orientation. In such an embodiment, the fan tray 100 can be configured to provide airflow in one direction, for example, during assembly, and the fan tray shoe 150 can be oriented such that the fan tray 100 can only be disposed within a chassis slot configured to accept a fan tray 100 providing airflow in that one direction.

The electronics assembly 160 is operable to electrically couple the fan tray 100 to the chassis via a connector 190. Similarly stated, the electronics assembly 160 can couple the fan tray 100 to a power source, computing device, and/or printed circuit board external to the fan tray 100 and/or disposed within the chassis. For example, when the fan tray 100 is coupled to a computing device or a printed circuit board, the electronics assembly 160 can exchange electrical signals between the chassis and the fan tray 100. The electronics assembly 160 can provide power from the chassis to the fan assembly 140, and/or can protect electrical wiring via a wire guide 170, and/or a sleeve 180. In some embodiments, the electronics assembly 160 can be operable to evaluate the operation and/or health of the fan assembly 140, and/or provide feedback to the chassis. The electronics assembly 160 can provide a user a visual status indicator for the fan tray 100 via a light source 185, such as an LED.

The connector 190 can be electrically coupled to a corresponding connector (e.g., a mating connector) disposed within the chassis. Thus, the fan tray 100 can receive power and/or one or more electrical signals from an electrical component, such as a power supply and/or a printed circuit board disposed within the chassis. The connector 190 can be coupled to the fan tray shoe 150, such that the connector 190 can be blind-coupled to the chassis connector when the fan tray 100 is disposed within the chassis. In some embodiments, the fan tray shoe 150 can be configured to position the connector 190 at an appropriate height and/or in an appropriate position such that when the fan tray 100 is disposed within the chassis, the connector 190 slideably couples with the chassis connector. In some such embodiments, the fan tray shoe 150 and/or the connector 190 can include a guide operable to position the connector 190 with respect to the chassis connector when the fan tray 100 is slid into the chassis. For example, a ramp or cone structure can urge the connector 190 in the direction of the chassis connector, and the fan tray shoe 150 can be operable to allow the connector 190 to move or float into the correct position for mating with the chassis connector. In some embodiments the connector 190 can be coupled to the fan tray shoe 150 in the appropriate location for mating with a specific chassis or chassis type during assembly of the fan tray 100.

The connector 190 can be coupled to one or more wires, which can route power and/or electrical signals to the fan assembly 140 and/or the light source 180. The wire guide 170 can direct wires from the connector 190 to the fan assembly 140 and/or the light source 180 and protect the wires from spinning rotors and/or from obstructing the flow path. In some embodiments, a side of the wire guide 170 facing the fan assembly 140 can have an aerodynamic shape operable to provide an efficient transition from the fan assembly 140 to an airflow opening in the fan tray shoe 150. A side of the wire guide 170 facing the connector 190 can be shaped such that the wires are retained in place and/or directed to the fan assembly 140 and/or the light source 180 without obstructing the airflow. The wire guide 170 can further prevent wires from pinching, for example, by corralling the wires during assembly.

The light source 185 can indicate to a user whether the fan tray 100 is powered on or off, and/or indicate a warning condition (e.g., fan failure, temperature alarm, over-speed, etc.). The light source 185 can be disposed within the sleeve 180. In some embodiments, the sleeve 180 can be a molded plastic sleeve that can provide insulation to the light source leads. For example, the light source leads can be bare wires, devoid of insulation, jackets, and/or heat-shrink insulating tubing for a length less than, similar to, and/or equal to the length of the sleeve 180. Similarly stated, the sleeve 180 can eliminate the need for traditional heat-shrink tubing for insulating at least a portion of the light source leads. By eliminating heat-shrink tubing and by providing insulated channels for the light source leads, the amount of space occupied by the light source leads can be reduced and/or the light source leads can be more precisely routed to the light source 185. For example, the light source leads, contained within the sleeve 180, can, in some embodiments, include sharper bends than would be possible with traditional heat-shrink insulation.

A light pipe 187, for example, a fiber optic cable, a transparent component, and/or acrylic cylinder, can be used to convey output from the light source 185 such that the output of the light source 185 can be perceived by the user. For example, the light source 180 can be located at the back of the fan tray 100, and the light pipe 187 can transmit the output of the light source 185 to the front of the fan tray 100 and/or through an opening defined by the cover 130. Similarly stated, in some embodiments, the light source 180 can be coupled to the fan tray shoe 150 in a rear portion of the fan tray 100 and the light pipe 187 can be operable to transmit the output of the light source 185 to a front portion of the fan tray 100. Positioning the light source 185 in the rear of the fan tray 100 can reduce and/or eliminate the extension of the light source leads the length of the fan tray 100, which can simplify assembly, enhance durability, and/or reduce the opportunity for airflow obstructions.

Figure 2:
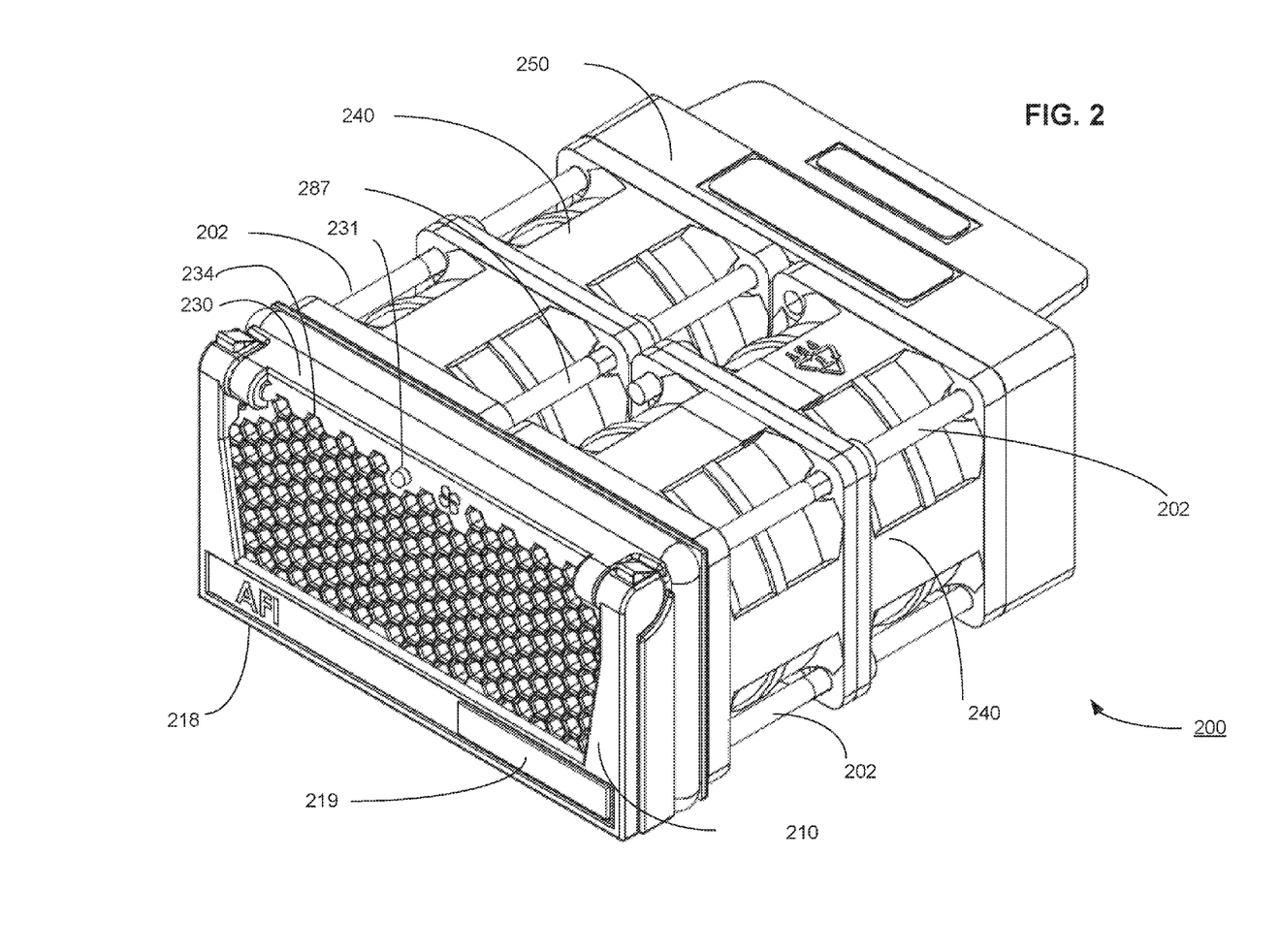
FIG. 2 is an isometric view of a fan tray, according to an embodiment.

FIG. 2 is an isometric view of a fan tray 200, according to an embodiment. The fan tray 200 can be structurally and/or functionally similar to the fan tray 100 described above with reference to FIG. 1. As shown in FIG. 2, a cover 230, two dual-rotor fans 240, and a fan tray shoe 250 are coupled together via screws 202. The fan tray 200 is configured to be removeably disposed at least partially within a chassis (not shown), such that the cover 230 is in fluid communication with an exterior volume of air, when the fan tray shoe 250 is disposed within an interior volume of the chassis. The cover 230 thus defines a first opening 234 of the fan tray 200 and the fan tray shoe 250 defines a second opening 254 (not shown in FIG. 2) of the fan tray 200. The cover 230 and the fan tray shoe 250 can each define one of an inlet or an outlet, depending on the direction of operation of the fans 240. As shown, the cover 230 defines multiple hexagonal openings 234.

An fan tray direction indicator 218 is coupled to a handle 210 and is operable to indicate to a user the direction of airflow the fan tray 200 is configured to supply. As shown, "AFI" indicates that the fan tray 200 is configured to move "airflow in" through the openings 234 of the front cover 230. In other embodiments, the fan tray direction indicator 218 can indicate, for example "AFO" indicating that the fan tray 200 is configured to move "airflow out" through the openings 234 of the front cover 230. For example, an indicator cover 219 can be operable to selectively expose one fan tray direction indicator 218. As shown, the indicator cover 219 can be covering an AFO indicator, such that if the indicator cover 219 were moved to cover the AFI indicator 218, the AFO indicator would be exposed.

In some embodiments, the indicator cover 219 can be operable to trigger a switch or electrical contact operable to alter the flow of the fan tray 200. For example, a user, by sliding the indicator cover 219 can change the direction of the airflow.

As described in further detail herein, the light pipe 287 is operable to transmit a signal from an LED 285 (not shown in FIG. 2) to the front of the fan tray 200. A hole 231 defined by the cover 230 can allow the user to observe the output of the LED 285 via the light pipe 287 from the front of the fan tray 200 when the fan tray 200 is disposed within the chassis.

Figure 3:
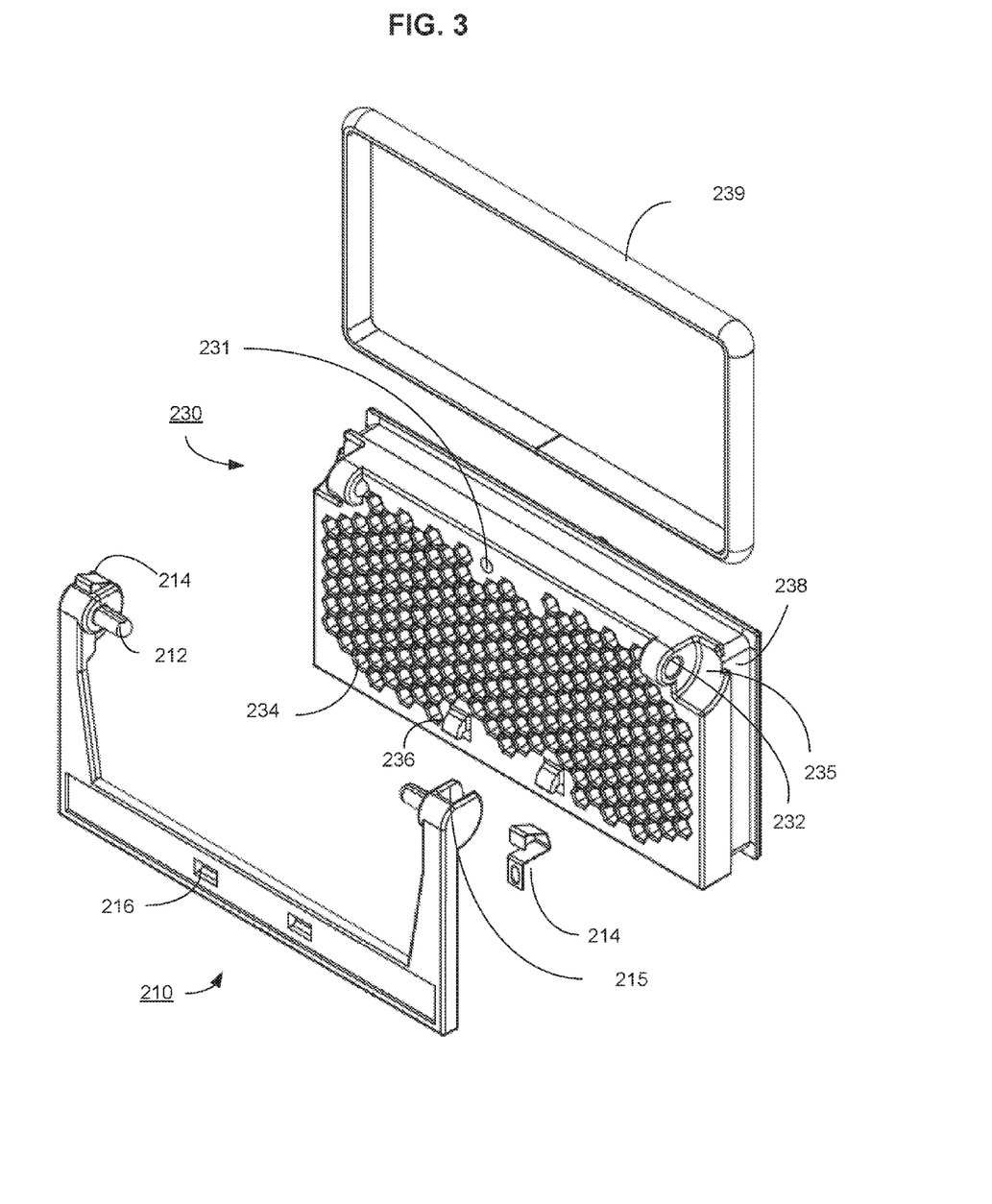
FIG. 3 is an exploded view of a front portion of the fan tray of FIG. 2.

FIG. 3 is an exploded view of a front portion of the fan tray 200 of FIG. 2. As shown in FIG. 3, the handle 210 is hingedly coupled to the cover 230 via two pins 212, which are configured to be disposed within two associated holes 232. The handle 210 can thereby rotate with respect to the cover 230 from a first position, in which the handle 210 is disposed against the surface of the cover 230, to at least a second position in which the handle 210 extends outwardly from the cover 230. When the handle 210 is in the first position, hooks 236 of the cover 230 can engage slots 216 of the handle 210, preventing the handle 210 from freely rotating. The hooks 236 and slots 216 can be configured to snap-fit, such that an initial minimum force is used to rotate the handle 210. Thus, the handle 210 can be secured in the first position to prevent unlatching during shipping, handling, vibration, inadvertent contact, and/or earthquakes, while allowing the handle 210 to freely rotate after the user applies an initial force to free the handle 210 from the cover 230.

One or more retaining clip(s) 214 can removeably couple the fan tray 200 to the chassis. As shown, the retaining clip(s) 214 are configured to be coupled to the handle 210 such that the retaining clip(s) 214 rotate with the handle 210. When the handle 210 is disposed against the surface of the cover 230, a portion of the retaining clip(s) 214 projects beyond the upper surface of the cover 230. The projecting portions of the retaining clip(s) 214 can engage an associated feature of the chassis, coupling the fan tray 200 to the chassis when the handle is disposed against the surface of the cover 230. In other embodiments, the retaining clip(s) 214 can be coupled to the cover 230 and operable to be selectively extended or retracted, for example, via a push-button, rotation of the handle 210, and/or any other suitable mechanism.

When the handle 210 rotates away from the front surface of the cover 230, the retaining clip(s) 214 rotate into the cover recesses 235. Thus, when the handle 210 extends away from the front surface of the cover 230, the retaining clip(s) 214 do not extend beyond the upper surface of the cover 230. Similarly stated, rotating the handle 210 into the second position can disengage the retaining clip(s) 214 from an associated feature of the chassis, allowing the fan tray 200 to slide within the chassis. For example, the user can slide the fan tray 200 out of the chassis by pulling on the handle 210 when the handle extends from the surface of the cover 230.

The retaining clip(s) 214 can be constructed of a resilient material, such as sheet metal. In some embodiments, the retaining clip(s) 214 can be leaf springs, operable to return to their original configuration after being deformed. As shown, the retaining clip(s) 214 are coupled to the handle 210 within the handle recesses 215. Furthermore, the portion of the retaining clip(s) 214 configured to project beyond the upper surface of the cover 230 has a ridge and/or a triangular shape (from a side perspective) with a sloped portion directed towards the rear of the fan tray 200 and a substantially vertical portion directed towards the front of the fan tray 200. A force applied to the sloped portion of the retaining clip 214 can cause the projecting portion of the retaining clip(s) 214 to deform into the handle recesses 215. Thus, when the fan tray 200 is inserted into the chassis and the handle 210 is disposed against the front surface of the cover 230, the sloped projecting portion of the retaining clip(s) 214 can contact the chassis, resulting in deformation causing the retaining clip(s) 214 to retract within the handle recess 215. With the retaining clip(s) 214 disposed within the handle recesses 215, the fan tray 200 can "snap" into the chassis. Similarly stated, the retaining clip(s) 214 can function similar to a door-latch, allowing the fan tray 200 to be inserted into the chassis with the retaining clip(s) 214 projecting beyond the upper surface of the cover 230. When the fan tray 200 is disposed within the chassis, however, the retaining clip(s) 214 can return to their original configuration and can engage a groove or other associated feature of the chassis. The substantially vertical portion of the retaining clip(s) 214 can resist deformation, preventing the fan tray 200 from being removed from the chassis while the retaining clip(s) 214 project beyond the upper surface of the cover 230 and into the groove or other associated feature of the cover.

The cover further includes a groove 238 operable to receive an electromagnetic interference (EMI) gasket 239. The EMI gasket 239 can be operable to contact the chassis and reduce the amount of interference transmitted to the interior of the chassis via the chassis opening configured to receive the fan tray 200. Similarly, the EMI gasket 239 also reduces the amount of interference transmitted from the interior of the chassis to electronics outside of and separate from the chassis.

Figure 4:
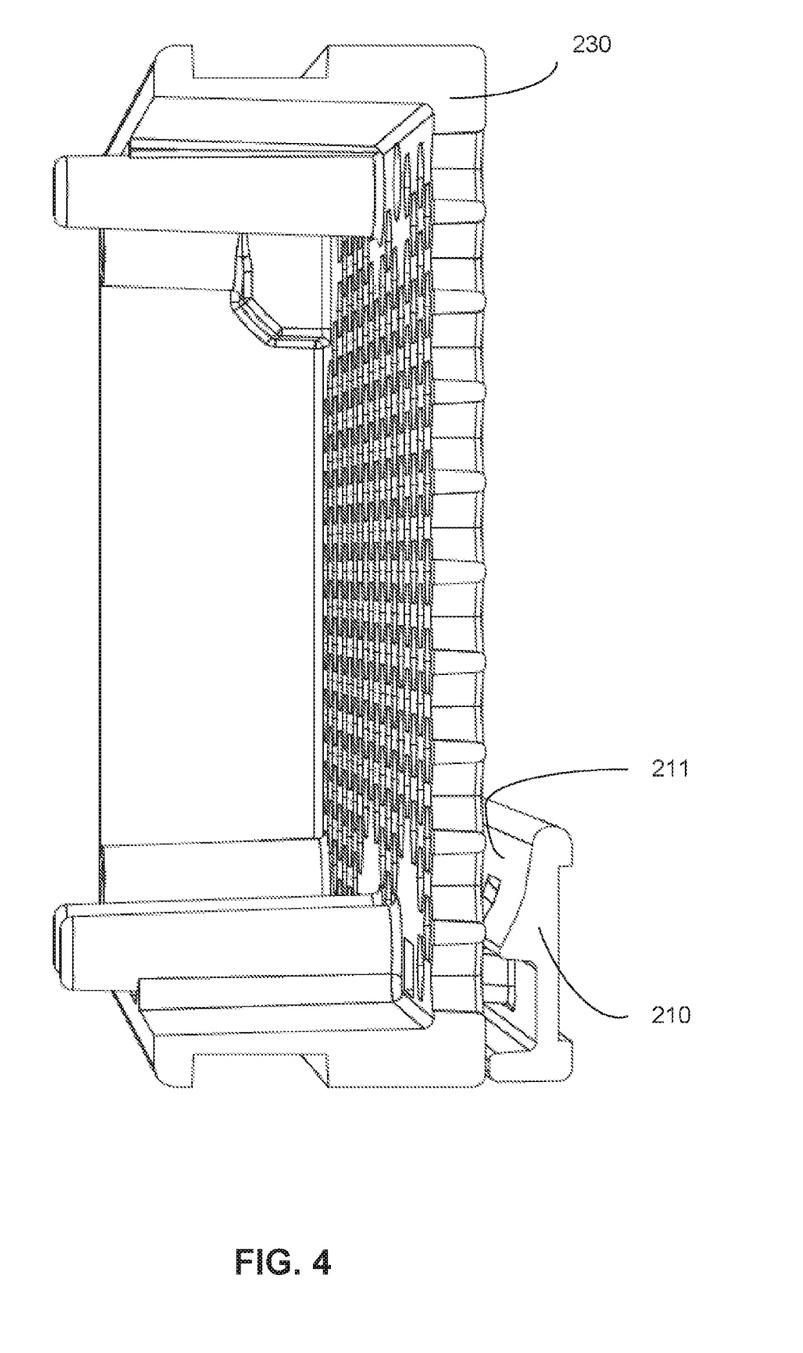
FIG. 4 is a perspective cross-sectional view of the front portion of the fan tray of FIG. 2.

FIG. 4 is a perspective cross-sectional view of the front portion of the fan tray 200 of FIG. 2. The handle 210 is disposed against the front surface of the cover 230. A beveled surface 211 of the handle 210 defines, at least in part, a plenum. The plenum can reduce or eliminate the handle 210 from obstructing the flow of air through the openings 234 of the cover 230. The beveled surface further defines a gap between the front surface of the cover 230 and the handle 210, such that the user can more easily decouple the handle 210 from the hooks 236.

Figure 5A:
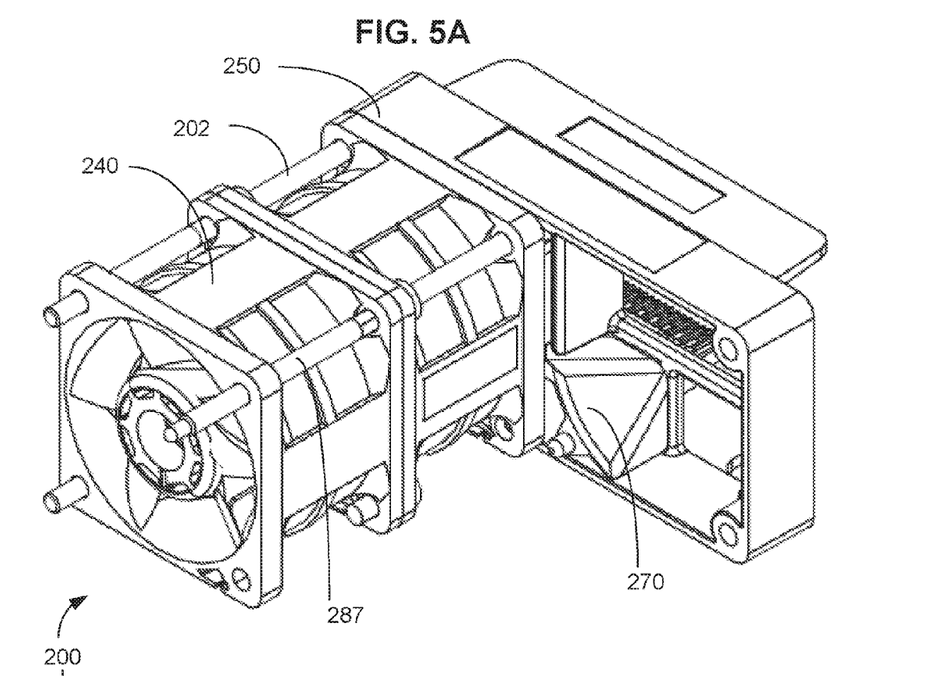
FIGS. 5A and 5B are isometric views of a portion of the fan tray of FIG. 2 with and without a wire guide, respectively.
Figure 5B:
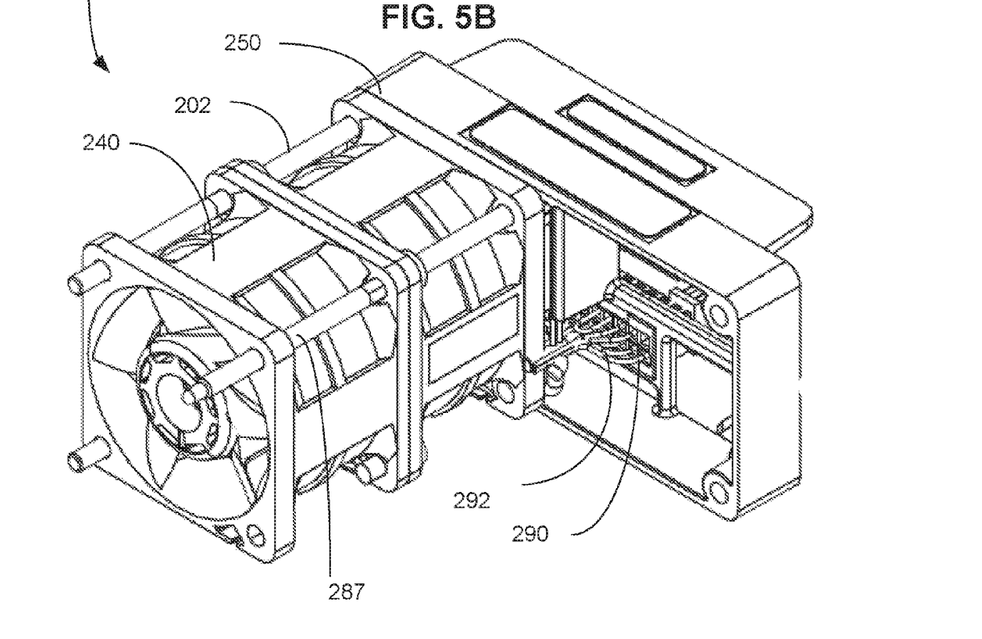
Figure 5C:
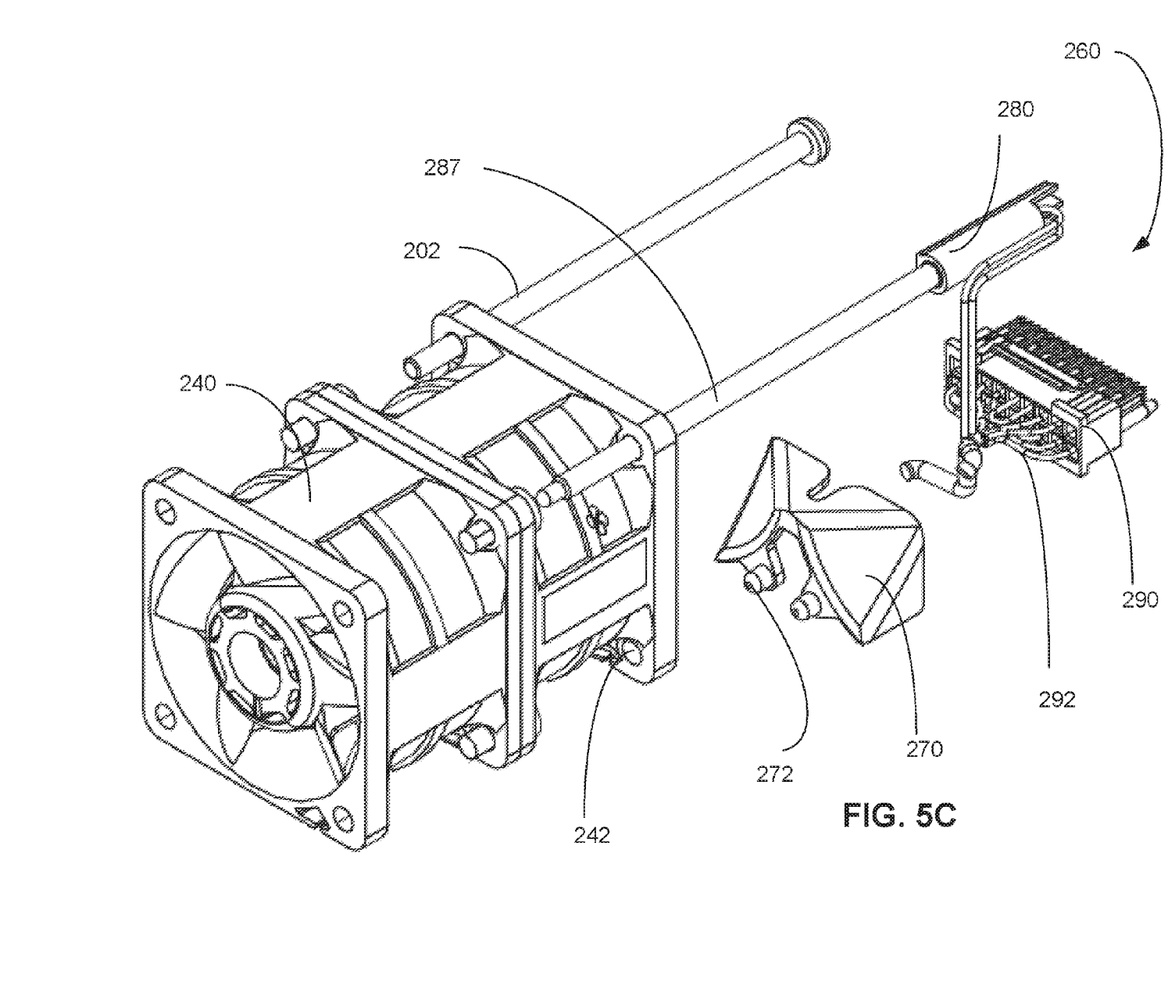
FIG. 5C is an isometric partially exploded view of a portion of the fan tray of FIG. 2.

FIGS. 5A and 5B are isometric views of a portion of the fan tray 200 of FIG. 2 with and without a wire guide 270, respectively. FIG. 5C is a partially exploded view of a portion of the fan tray 200 of FIG. 2. The wire guide 270 (also referred to herein as a "wire-guide housing") is configured to be disposed between the fans 240 and the connector 290. The connector 290 is operable to couple with a corresponding (e.g., mating) connector of the chassis. One or more leads or wires 292 can be electrically couple the connector 290 to the fans 240. For example, the wire guide 270 can define one or more wire-paths between the connector and the fans 240 and/or the light source sleeve 280.

The wire guide 270 can provide a smooth and/or streamlined transition for the air flow path between the fans 240 and the fan tray shoe 250 and/or isolate some or all of an electronics assembly 260 from the flow path. Thus, the connector 290 and/or some or all of the wires 292, can be disposed out of the flow path and/or not disrupt, impede, and/or impinge the flow of air through the fan tray 200. Said another way, the wire guide 270 can provide a smooth surface having an aerodynamic shape that provides for reduced or minimal flow resistance for the air flow between the fans 240 and the fan tray show 250.

The wire guide 270 can have one or more projections 272 configured to couple to and/or be disposed within associated holes 242 of the fans 240. In some embodiments, during assembly, the wire guide 270 can be coupled to the fans 240 before an LED sleeve 280, the wires 292 and/or other electronic components are assembled. In such embodiments, the wire guide 270 can corral the wires 292, reducing the opportunity for the wires 292 to be pinched, stretched, and/or damaged during assembly and/or use. Said another way, the projections 272 of the wire guide 270 align the wire guide 270 relative to the fans 240 so that the blades of the fans 240 do not interfere with wires 292 and the electronics assembly 260 can be held firmly once assembled.

Figure 6:
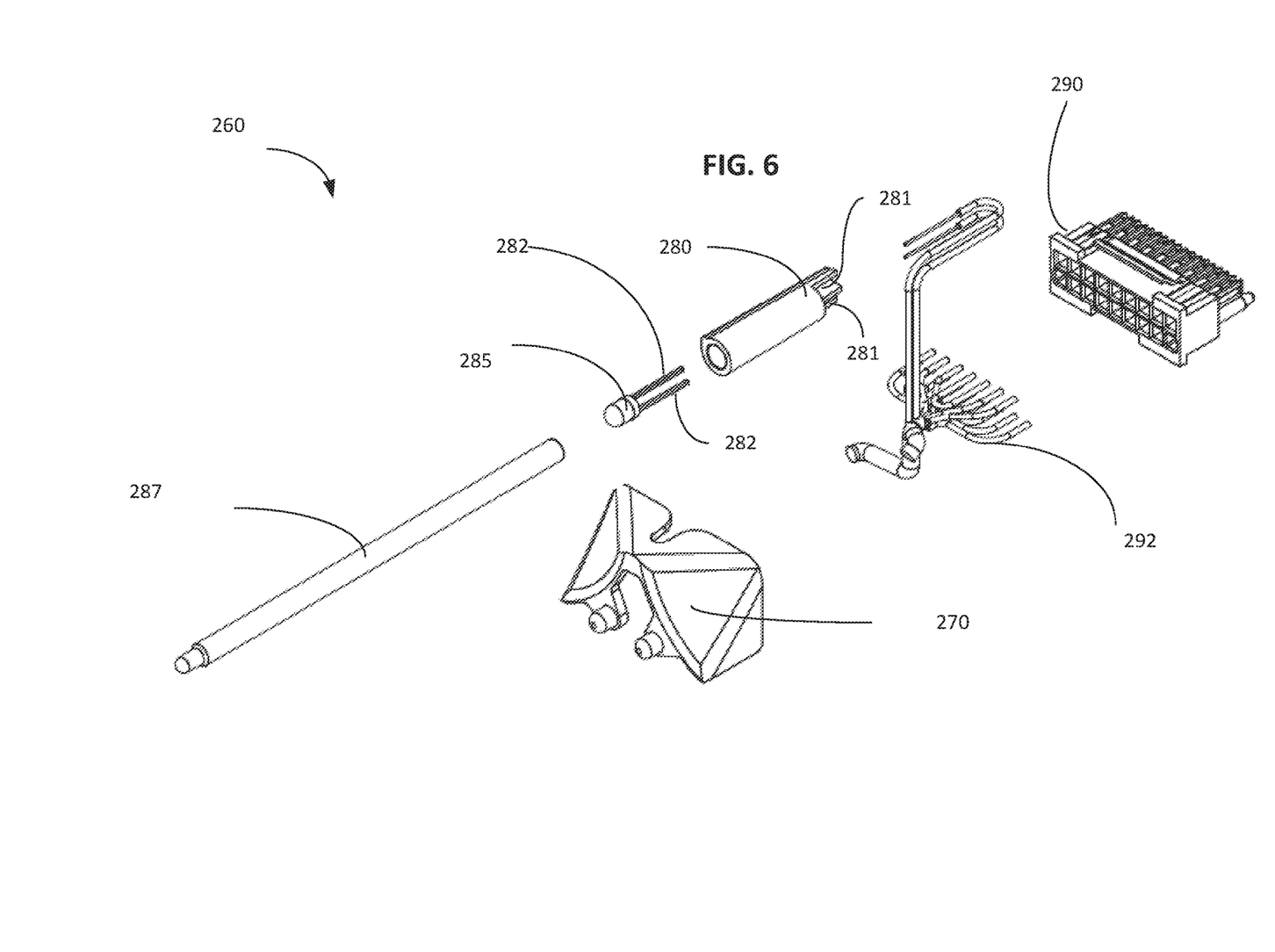
FIG. 6 is an exploded view of an electronics assembly of the fan tray of FIG. 2.

FIG. 6 is an exploded view of the electronics assembly 260 of the fan tray 200 of FIG. 2. The connector 290 can be coupled to the wires 292, which can in turn be coupled to the LED 285 and/or the fans 240 (not shown in FIG. 6), respectively. The LED 285 and, in some embodiments, at least a portion of LED leads 282 can be disposed within and/or molded into the LED sleeve 280. In some embodiments, the LED sleeve 280 can contain and/or channel bare LED leads 282, and/or can provide end-to-end insulation for the LED leads 282. For example, the LED sleeve 280 can include channels 281, grooves, chambers, and/or any other suitable structure operable to electrically isolate the LED leads 282. The LED sleeve 280 can thereby reduce or eliminate the need for traditional heat-shrink tubing to insulate the LED leads 282. Because heat-shrink insulation can be bulker and can increase the minimum radius of curvature of bends in the LED leads 282, the LED sleeve 280 can reduce the footprint and/or improve the durability of the electronics assembly 260.

The light pipe 287 can be coupled to, disposed against, and/or located proximate to the LED 285 and/or the LED sleeve 280. The light pipe 287 can be operable to receive the visual output of the LED 285 at a rear end, and transmit the visual output to a front end. Thus, the light pipe 287 can convey the output of the LED 285, which can be located at the rear of the fan tray 200, to the front of the fan tray 200.

The light pipe 287 can therefore reduce the length of the LED leads 282 used to convey a visual signal to the front of the fan tray 200.

As described above, the wire guide 270 can be configured to corral and/or limit the location and/or movement of the wires 292. In some embodiments, the wire guide 270 can be located between the wires 292 and the fans 240. For example, the wires 292 can coupled to the fans 240 at or near an opening of the wire guide 270. In some embodiments, the wires 292 can be coupled to the fans 240 within 2 mm of an opening of the wire guide, within approximately 5 mm, 10 mm, or within any other suitable distance from an opening of the wire guide 270. Similarly, in some embodiments, the LED sleeve 280 can couple to and/or insulate LED leads 282 from the connector 290 and/or the wire guide 270 to the LED 285.

Figure 7A:
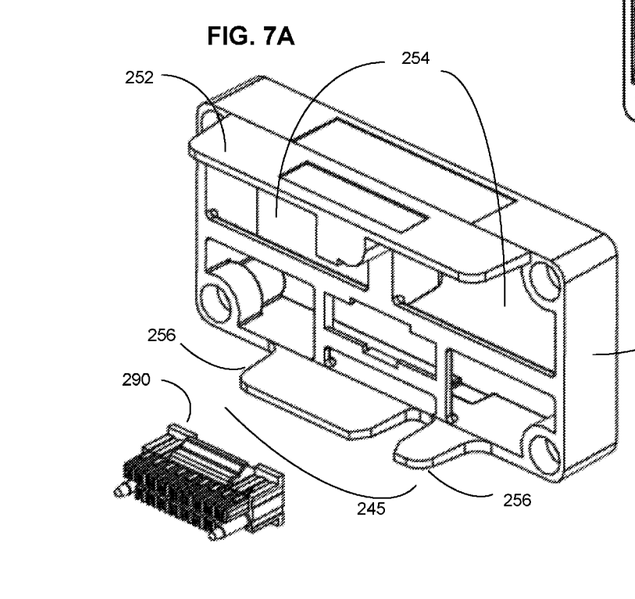
FIGS. 7A and 7B are a rear exploded isometric view and a rear view of the fan tray shoe and a connector of the fan tray of FIG. 2, respectively.
Figure 7B:
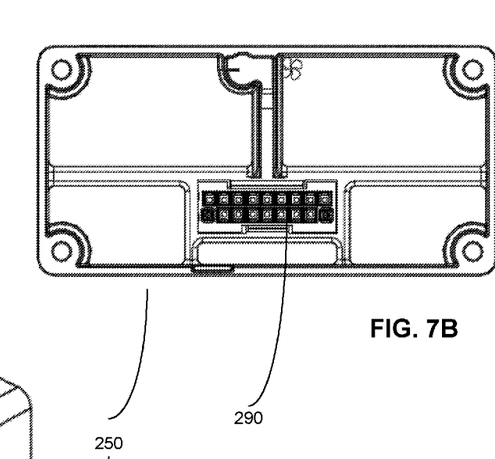

FIGS. 7A and 7B are a rear exploded isometric view and a rear view of the fan tray shoe 250 and the connector 290, of the fan tray 200 of FIG. 2, respectively. As described above with reference to FIG. 2, the fan tray shoe 254 can define an opening 254 for inlet and/or outlet of the airflow. In some embodiments, the fan tray shoe 250 can provide structural rigidity for the fan tray 200, for example, by including one or more stiffening flanges 252 and 256. The stiffening flanges 252 can be operable to resist torsion and/or flexion that the fan tray may experience, for example, during assembly, handling, and/or use.

The fan tray shoe 250 can further include a key structure 256. The key structure 245 (including stiffening flanges 252 and 256) can, in some embodiments, include one or more slots, grooves, rods, and/or holes of various shapes, sizes, and/or extending various distances from the fan tray shoe 250. The key structure 245 can mateingly couple with an associated structure disposed within the chassis. The keying structure 245 can be operable to ensure that the fan tray 200 can be fully disposed only within a slot in the chassis designed to receive the fan tray 200. For example, the chassis can have a projection disposed within the chassis that will exclude the fan tray 200, e.g., prevent the fan tray 200 from sliding partially or completely within the chassis, and/or prevent the connector 290 from mating with the corresponding (e.g., mating) connector of the chassis, unless the projection corresponds with a slot of the fan tray shoe 250.

In some embodiments, the fan tray shoe 250 can be reversible, such that it can be alternatively disposed within at least two different types of chassis slots. For example, when the fan tray shoe 250 is coupled to the fan tray 200 in a first configuration, the fan tray 200 is configured to be disposed in a slot operable to receive a fan tray configured to direct cooling air into the chassis; when the fan tray shoe is coupled to the fan tray 200 is a second configuration (e.g., rotated 180 degrees), the fan tray 200 is configured to be disposed in a slot operable to receive a fan tray configured to remove air from the chassis. Similarly stated, the location of the keying structure 256 on the fan tray 200 can be associated with the direction of airflow generated by the fans 240. The keying structure 256 can thereby assure that an inlet fan tray can only be disposed within a chassis slot configured to receive an inlet fan tray, while an outlet fan tray can only be disposed within a chassis slot configured to receive an outlet fan tray. In other embodiments, the keying structure 256 can be configured such that the fan tray 200 can be disposed within either an inlet or an outlet chassis slot.

In yet other embodiments, the key structure can be associated with information other than or in addition to air flow direction, such as a fan having one rotor or two rotors, a fan having one fan speed or a different fan speed, a fan having one drive voltage or a different drive voltage. For example, in such an embodiment, a first position of the key structure can be associated with a fan having one rotor, and a second position of the key structure can be associated with a fan having two rotors. For another example, a first position of the key structure can be associated with a fan having one fan speed, and a second position of the key structure can be associated with a fan having a different fan speed. For yet another example, a first position of the key structure can be associated with a fan having one drive voltage, and a second position of the key structure can be associated with a fan having a different drive voltage.

The connector 290 is coupled to the fan tray shoe 250. The fan tray shoe 250 can thereby define the vertical position, the horizontal position, and/or the depth of the connector 290. The position of the connector 290 can be defined such that it will align with the corresponding connector of the chassis when the fan tray 200 is coupled thereto. In some embodiments, the fan tray shoe 250 can include multiple connector positions. In such embodiments, the vertical, horizontal, position and/or depth of the connector 290 can be adjusted, for example, by selecting a connector position during assembly, such that the connector 290 position corresponds to the location of the associated chassis connector.

Figures 8A, 8B:
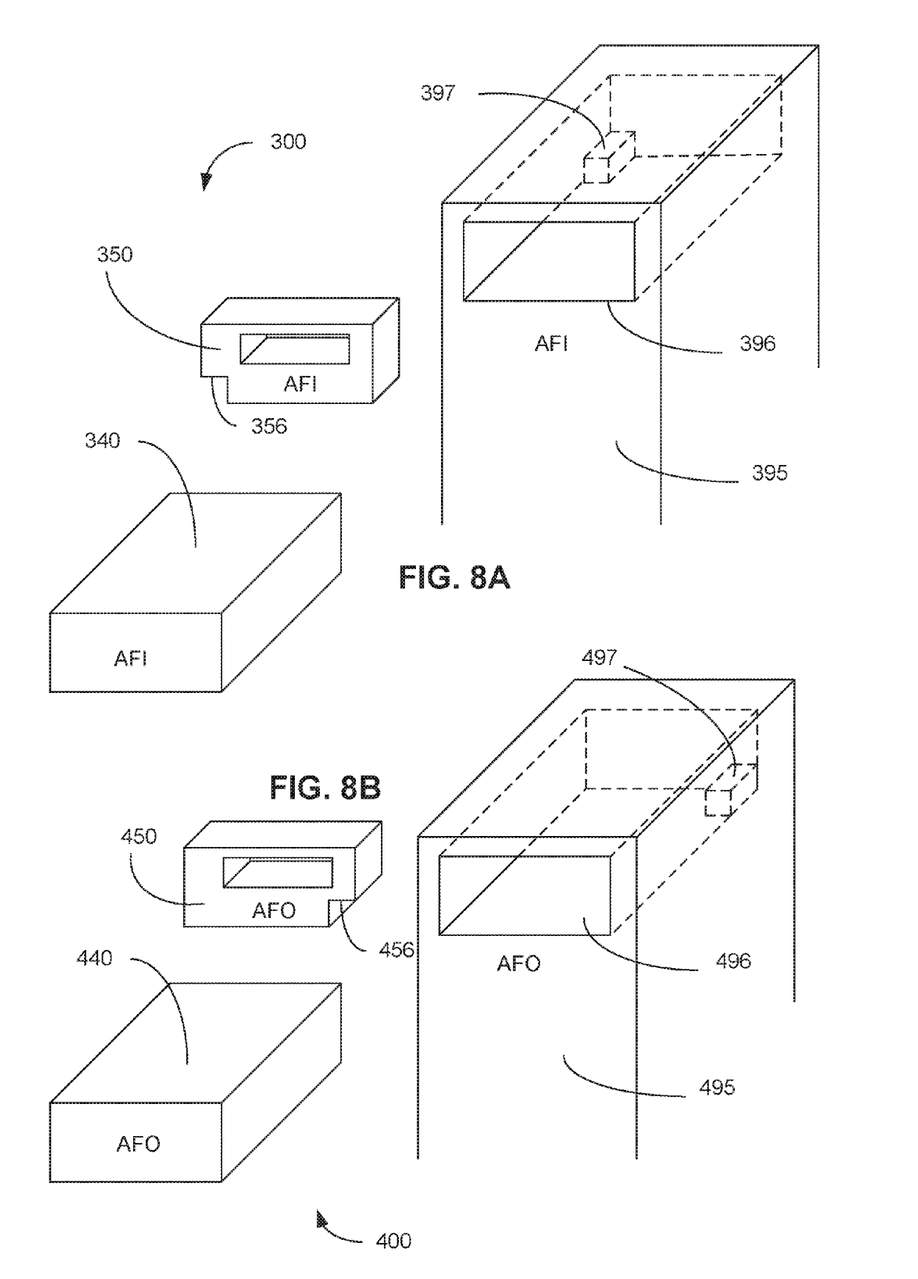
FIGS. 8A and 8B are schematic diagrams of a fan tray body, a fan tray shoe, and a chassis, according to some embodiments.

FIG. 8A is a schematic diagram of a fan tray 300 and chassis 395, according to an embodiment. The fan tray 300 can be an air-flow-in (AFI) fan tray, and can be structurally and/or functionally similar to the fan trays 100 and/or 200 as shown and described above with reference to FIGS. 1-7B (inclusive). The fan tray 300 can include a fan assembly 340, a fan tray shoe 350, and/or any other structures and components described above, such as, a retaining clip, a handle, a cover, an electronics assembly, etc. (not shown).

The chassis 395 can be a structure configured to receive the fan tray 300, such as, for example, a rack-mounted unit, such as a top-of-rack switch, a server chassis, and/or any other suitable chassis or enclosure. The chassis 395 includes an opening 396, which can be approximately the same size and/or shape as the fan tray 300. For example, the opening 396 can have a height and/or a width approximately 1 mm, approximately 3 mm, or approximately 5 mm, greater than a height and/or a width of the fan tray 300, and/or the opening 396 can be any other suitable size. Thus, in some embodiments, the fan tray 300 can be slideably disposed within the opening 396.

The fan tray shoe 350 is configured to be coupled to the rear of the fan assembly 340. As described above, the fan tray shoe 350 is configured to selectively key the fan tray 300 to a particular chassis and/or type of chassis. As shown, the fan tray shoe 350 is configured to be coupled to an AFI fan tray 300, such that the AFI fan tray 300 can be selectively coupled to an AFI chassis 395 and/or selectively excluded from an air-flow-out (AFO) chassis (e.g., the AFO chassis 495 as shown in FIG. 8B and described in further detail below).

The fan tray shoe 350 includes a key structure 356. As shown, the key structure 356 is a cut-out portion of a corner of the fan tray shoe 350. The key structure 356 is configured to interact with a lock structure 397 disposed within the chassis. In other embodiments, the key structure 356 can be a projection, a hole, a slot, a tab, and/or any other suitable spatial key. In yet other embodiments, the key structure 356 can be an electric and/or magnetic "key" configured to interact with a corresponding "lock" disposed within the chassis 395 and configured to sense the presence of the key structure 356.

FIG. 8B is a schematic diagram of a fan tray 400 and chassis 495, according to an embodiment. The fan tray 400 can be an AFO fan tray, and can be structurally and/or functionally similar to the fan trays 100 and/or 200 as shown and described above with reference to FIGS. 1-7B (inclusive). The fan tray 400 can include a fan assembly 440, a fan tray shoe 450, and/or any other structures and components described above, such as, a retaining clip, a handle, a cover, an electronics assembly, etc. (not shown).

The chassis 495 can be structurally and/or functionally similar to the chassis 395 described above with reference to FIG. 8A. The chassis 495 can differ from the chassis 395 in that the chassis 495 can be an AFO chassis. Similarly stated, the chassis 495 can be configured to have air removed from a slot 496, and/or can have a lock structure 497 configured to selectively accept an AFO fan tray (e.g., the AFO fan tray 400) and/or selectively exclude an AFI fan tray (e.g., the AFI fan tray 300).

The AFO fan tray shoe 450 can be configured to be coupled to an AFO fan assembly 440. In some embodiments, the AFO fan tray shoe 450 can differ from the AFI fan tray shoe 350 only in orientation. Similarly stated, during assembly, a fan tray shoe can be coupled to a fan tray in an orientation such that the fan tray is collectively configured to be slideably disposable only within a certain chassis and/or type of chassis. For example, as shown, the AFI fan tray shoe 350 and the AFO fan tray shoe 450 can be a common fan tray shoe oriented different with respect to the fan tray 400 such that the combination of the fan tray and the fan tray shoe collectively define a keyed assembly that is insertable into an AFO chassis or AFI chassis without being insertable into the other (AFI chassis or AFO chassis, respectively).

While various embodiments have been described above, it should be understood that they have been presented by way of example only, and not limitation. For example, although some embodiments describe a fan tray operable to be coupled to a server rack, in other embodiments, such a fan tray can be operable to couple to industrial equipment, kitchen equipment, otherwise positioned in any situation in which airflow is desired.

Although various embodiments have been described as having particular features and/or combinations of components, other embodiments are possible having a combination of any features and/or components from any of embodiments where appropriate. For example, although some embodiments of a fan tray are described as having an inlet on a first end and an outlet on a second end, in other embodiments the fan tray can have both inlets and outlets on one side. For example, in some embodiments, the fan tray can have one fan operable to direct air into a chassis and a second fan operable to remove air from the chassis positioned side-by-side. Such an embodiment could be operable to circulate air within the chassis, for example, via an internal baffle that circulates the air in a "U" shaped path within the fan tray.

What is claimed is:

1. An apparatus, comprising:
a fan tray having a first end and a second end opposite the first end, the fan tray configured to be slideably disposed within a chassis by inserting the first end of the fan tray into the chassis; and
a key removeably coupled to the fan tray such that the key can be moved relative to the fan tray from a first position to a second position, the first position associated with a first air flow direction, the second position associated with a second air flow direction opposite the first air flow direction.

2. The apparatus of claim 1, wherein:
the key is coupled to the fan tray in the first position; and
the key is configured to be received by a lock of the chassis associated with the first air flow direction such that the fan tray matingly couples with the chassis when the fan tray is inserted into an opening of the chassis associated with the first air flow direction.

3. The apparatus of claim 1, wherein:
the key is coupled to the fan tray in the first position;
the key is configured to be received by a lock of the chassis associated with the first air flow direction such that the fan tray matingly couples with the chassis when the fan tray is inserted into an opening of the chassis associated with the first air flow direction; and
the key is configured such that the chassis rejects the fan tray when the fan tray is inserted into an opening of the chassis associated with the second air flow direction.

4. The apparatus of claim 1, further comprising:
a fan coupled to the fan tray; and
a connector coupled to the fan tray, the connector configured to matingly couple with a corresponding connector of the chassis to drive the fan.

5. The apparatus of claim 1, wherein the key is coupled to the fan tray in the first position, the apparatus further comprising:
a fan coupled to the fan tray; and
a connector coupled to the fan tray, the connector configured to matingly couple with a corresponding connector of the chassis to drive the fan, the key is configured such that the connector and the corresponding connector of the chassis matingly couple when the fan tray is inserted into an opening of the chassis associated with the first air flow direction.

6. The apparatus of claim 1, wherein the key is coupled to the fan tray in the first position, the apparatus further comprising:
a fan coupled to the fan tray; and
a connector coupled to the fan tray, the connector configured to matingly couple with a corresponding connector of the chassis to drive the fan, the key is configured such that (1) the connector and the corresponding connector of the chassis matingly couple when the fan tray is inserted into an opening of the chassis associated with the first air flow direction and (2) the connector is prevented from matingly coupling with the corresponding connector of the chassis when the fan tray is inserted into an opening of the chassis associated with the second air flow direction.

7. A system, comprising:
a chassis defining an opening;
a fan tray configured to be slideably disposed into the opening of the chassis, the fan tray configurable to move air in a first direction or a second direction opposite the first direction; and
a first key removeably coupled to the fan tray in a first position such that the fan tray is configured to move air in the first direction, the chassis and the fan tray collectively configured such the chassis accepts the fan tray via the opening, the fan tray configured to accept a second key, when the second key is coupled to the fan tray in a second position relative to the fan tray, the fan tray being configured to move air in the second direction, the chassis and the fan tray collectively configured such that the chassis rejects the fan tray via the opening when the fan tray is configured to move air in the second direction.

8. The system of claim 7, wherein:
the chassis includes a lock within the opening that corresponds to the first key being coupled to the fan tray in the first position.

9. The system of claim 7, wherein:
the chassis includes a lock within the opening that corresponds to the second key being coupled to the fan tray in the second position, the lock configured to reject the fan tray when the second key is coupled to the fan tray in the second position.

10. The system of claim 7, wherein:
the chassis includes a lock within the opening;
the first key is coupled to an end portion of the fan tray in the first position ; and
the end portion of the fan tray is configured to be inserted into the opening such that the fan tray can be slideably disposed within the chassis.

11. The system of claim 7, wherein the fan tray is a first fan tray configured to move air in the first direction, the opening is a first opening, and the chassis defines a second opening, the system further comprising:
a second fan tray configured to move air in the second direction, the chassis and the second fan tray collectively configured such that the chassis accepts the second fan tray via the second opening.

12. The system of claim 7, wherein:
the fan tray is a first fan tray configured to move air in the first direction;
the opening is a first opening;
the chassis defines a second opening; and
the chassis and the first fan tray are collectively configured such that the chassis rejects the first fan tray via the second opening, the system further comprising:
a second fan tray configured to move air in the second direction, the chassis and the second fan tray collectively configured such that the chassis accepts the second fan tray via the second opening, the chassis and the second fan tray are collectively configured such that the chassis rejects the second fan tray via the first opening.

13. The system of claim 7, wherein:
the fan tray is a first fan tray;
the opening is a first opening; and
the chassis defines a second opening, the system further comprising:
a second fan tray configured to move air in the second direction, the second fan tray including the second key coupled to the second fan tray in the second position associated with the second air flow direction, the chassis and the second fan tray collectively configured such that the chassis accepts the second fan tray via the second opening;
the chassis includes a first lock within the first opening configured to accept keys in the first position; and
the chassis includes a second lock within the second opening configured to accept keys in the second position.

14. The system of claim 7, wherein:
the fan tray is a first fan tray;
the opening is a first opening; and
the chassis defines a second opening, the system further comprising:
a second fan tray configured to move air in the second direction, the second fan tray including the second key coupled to the second fan tray in the second position associated with the second air flow direction, the chassis and the second fan tray collectively configured such that the chassis accepts the second fan tray via the second opening;
the chassis includes a first lock within the first opening configured to accept keys in the first position;
the chassis includes a second lock within the second opening configured to accept keys in the second position; and
the first lock is configured to reject keys in the second position.

15. The system of claim 7, wherein the first key is a portion of a shoe removeably coupled to the fan tray in the first position, the system further comprising:
a connector coupled to the shoe, the connector configured to electrically couple the fan tray to the chassis when the shoe is coupled to the fan tray in the first position.

16. The apparatus of claim 1, wherein the key is a portion of a shoe removeably coupled to the fan tray, the apparatus further comprising:
a connector coupled to the shoe, the connector configured to electrically couple the fan tray to the chassis when the shoe is coupled to the fan tray in the first position.

17. The apparatus of claim 1, wherein:
the key is a portion of a shoe removeably coupled to the fan tray; and
the key is configured to be accepted by a lock of the chassis when the shoe is coupled to the fan tray in the first position, the apparatus further comprising:
a connector coupled to the shoe, the key and the lock collectively configured to prevent the connector from being electrically coupled to the chassis when the shoe is coupled to the fan tray in the second position.

18. An apparatus, comprising:
a fan tray configured to be slideably disposed within a chassis having a lock;
a shoe removeably coupled to the fan tray in one of a first position or a second position relative to the fan tray, the first position associated with a first air flow direction, the second position associated with a second air flow direction opposite the first air flow direction, the shoe including a key, the lock configured to accept the key when the shoe is coupled to the fan tray in the first position, the lock configured to reject the key when the shoe is coupled to the fan tray in the second position; and
a connector coupled to the shoe, the connector configured to electrically couple the fan tray to the chassis when the lock accepts the key.

19. The apparatus of claim 18, wherein the lock is configured to prevent the connector from electrically coupling with the chassis when the key is in the second position.

20. The apparatus of claim 18, wherein a position of the connector relative to the shoe is adjustable.

* * * * *